(12) United States Patent
Mei et al.

(10) Patent No.: US 12,056,994 B2
(45) Date of Patent: Aug. 6, 2024

(54) SYSTEMS AND METHODS FOR IMPROVED OBJECT PLACEMENT SENSING FOR POINT-OF-PURCHASE SALES

(71) Applicant: Xerox Corporation, Norwalk, CT (US)

(72) Inventors: Ping Mei, San Jose, CA (US); Robert Anthony Street, Palo Alto, CA (US); Kent Evans, Sunnyvale, CA (US)

(73) Assignee: Xerox Corporation, Norwalk, CT (US)

(*) Notice: Subject to any disclaimer, the term of this patent is extended or adjusted under 35 U.S.C. 154(b) by 884 days.

(21) Appl. No.: 16/929,531

(22) Filed: Jul. 15, 2020

(65) Prior Publication Data
US 2022/0020253 A1    Jan. 20, 2022

(51) Int. Cl.
| | |
|---|---|
| G08B 13/14 | (2006.01) |
| A41D 31/04 | (2019.01) |
| B32B 5/02 | (2006.01) |
| B32B 25/10 | (2006.01) |
| H01B 1/22 | (2006.01) |
| H01B 5/14 | (2006.01) |
| H05K 1/18 | (2006.01) |
| H05K 3/10 | (2006.01) |

(52) U.S. Cl.
CPC ......... *G08B 13/1472* (2013.01); *A41D 31/04* (2019.02); *B32B 5/024* (2013.01); *B32B 5/028* (2013.01); *B32B 25/10* (2013.01); *H01B 1/22* (2013.01); *H01B 5/14* (2013.01); *H05K 1/18* (2013.01); *H05K 3/10* (2013.01); *B32B 2307/202* (2013.01); *C09J 2203/358* (2020.08)

(58) Field of Classification Search
CPC ..... G08B 13/1472; B32B 5/024; B32B 5/028; B32B 2307/202
See application file for complete search history.

(56) References Cited

U.S. PATENT DOCUMENTS

| | | | |
|---|---|---|---|
| 3,584,162 | A | 6/1971 | Krakinowski |
| 4,017,697 | A | 4/1977 | Larson |
| 4,362,911 | A | 12/1982 | Sears et al. |
| 4,508,942 | A | 4/1985 | Inaba |
| 4,677,417 | A | 6/1987 | Amagishi |

(Continued)

FOREIGN PATENT DOCUMENTS

EP    2820518    1/2015

OTHER PUBLICATIONS

Pressure-Sensitive Conductive Sheet (Velostat/Linqustat), https://www.adafruit.com/product/1361, Nov. 8, 2019.

(Continued)

*Primary Examiner* — Hoi C Lau
(74) *Attorney, Agent, or Firm* — Fox Rothschild LLP

(57) ABSTRACT

Systems and methods are provided for monitoring object placement on a surface. The system includes a pressure-sensitive conductive sheet. The pressure-sensitive conductive sheet includes a stretchable fabric, having a plurality of fibers, and a conductive material positioned on a plurality of adjoining fibers of the stretchable fabric. The system further includes a 3-dimensional structure positioned under the pressure-sensitive conductive sheet. The 3-dimensional structure includes one or more depressions onto which the stretchable fabric can be stretched and the conductive material is positioned over the one or more depressions.

13 Claims, 14 Drawing Sheets

(56) References Cited

U.S. PATENT DOCUMENTS

| | | | |
|---|---|---|---|
| 4,866,412 A * | 9/1989 | Rzepczynski | G06F 3/04144 338/114 |
| 4,935,841 A * | 6/1990 | Jonsson | G01L 9/0075 361/283.4 |
| 5,198,629 A | 3/1993 | Hayashi et al. | |
| 5,828,289 A | 10/1998 | Burgess | |
| 6,360,612 B1 * | 3/2002 | Trantzas | G01L 1/20 73/753 |
| 6,774,331 B1 | 8/2004 | Den Ridder et al. | |
| 7,726,207 B2 * | 6/2010 | Orlewski | G01G 19/4142 73/862.041 |
| 9,030,289 B2 | 5/2015 | Lai | |
| 9,671,297 B2 * | 6/2017 | Sibbett | G06F 3/045 |
| 9,761,790 B2 * | 9/2017 | Yoo | B32B 37/12 |
| 9,831,051 B2 | 11/2017 | Maier | |
| 10,121,121 B1 | 11/2018 | De Bonet et al. | |
| 10,390,752 B2 * | 8/2019 | Ashoori | A61B 5/1116 |
| 10,442,091 B2 * | 10/2019 | Kondoh | B25J 13/082 |
| 10,561,581 B2 * | 2/2020 | Wong | G08B 21/18 |
| 10,628,725 B1 | 4/2020 | Mei et al. | |
| 10,690,559 B1 * | 6/2020 | Liu | H01M 4/02 |
| 10,859,458 B2 * | 12/2020 | Asakura | H10N 30/50 |
| 10,928,259 B2 * | 2/2021 | Morita | G06F 3/0414 |
| 11,367,581 B1 * | 6/2022 | Santos | H01H 13/14 |
| 2002/0014968 A1 * | 2/2002 | Fitzgerald | H01H 3/141 340/573.1 |
| 2003/0000821 A1 | 1/2003 | Takahashi et al. | |
| 2005/0253723 A1 | 11/2005 | Shafer | |
| 2010/0224474 A1 * | 9/2010 | Jeffery | H01H 13/704 200/512 |
| 2010/0242629 A1 * | 9/2010 | Leuenberger | H01G 13/00 73/862.625 |
| 2011/0140853 A1 | 6/2011 | Jung et al. | |
| 2012/0040610 A1 | 2/2012 | Moosavi et al. | |
| 2012/0118066 A1 * | 5/2012 | Majidi | G01L 1/205 73/719 |
| 2013/0004750 A1 | 1/2013 | Majumdar et al. | |
| 2014/0215928 A1 * | 8/2014 | Desgorces | G08B 21/0461 52/1 |
| 2014/0243709 A1 * | 8/2014 | Gibson | G01L 1/18 600/587 |
| 2014/0253333 A1 | 9/2014 | Patterson et al. | |
| 2015/0311012 A1 * | 10/2015 | Wada | H10N 30/302 200/514 |
| 2016/0056444 A1 | 2/2016 | Hwang et al. | |
| 2016/0336505 A1 * | 11/2016 | Arizumi | H02N 1/08 |
| 2017/0065464 A1 * | 3/2017 | Heil | A61F 13/42 |
| 2017/0089775 A1 * | 3/2017 | Hsu | G01L 1/16 |
| 2017/0207729 A1 * | 7/2017 | Kondoh | A41D 1/005 |
| 2017/0256155 A1 | 9/2017 | Sengstaken, Jr. | |
| 2018/0093814 A1 | 4/2018 | Espinosa | |
| 2018/0288889 A1 | 10/2018 | Fordham et al. | |
| 2018/0319016 A1 * | 11/2018 | Ibrocevic | G01L 1/205 |
| 2018/0320380 A1 | 11/2018 | Crowther | |
| 2019/0101462 A1 * | 4/2019 | Kim | G01L 5/0061 |
| 2019/0103548 A1 * | 4/2019 | Sugawara | H10N 30/87 |
| 2019/0151160 A1 * | 5/2019 | Huq | A61F 13/01038 |
| 2019/0231083 A1 * | 8/2019 | Hsu | A61G 7/05776 |
| 2022/0020253 A1 * | 1/2022 | Mei | H01B 1/22 |
| 2022/0125335 A1 * | 4/2022 | Rofe | G01L 5/0014 |

OTHER PUBLICATIONS

U.S. Appl. No. 16/943,380, filed Jul. 30, 2020, Systems and Methods for Improved Sensing Performance of Pressure-Sensitive Conductive Sheets.

U.S. Appl. No. 17/228,991, filed Apr. 13, 2021, Membrane Switches Configured to Sense Pressure Applied From Compliant and Rigid Objects.

U.S. Appl. No. 17/228,998, filed Apr. 13, 2021, Membrane Switches Configured to Sense Pressure Applied From Compliant and Rigid Objects.

* cited by examiner

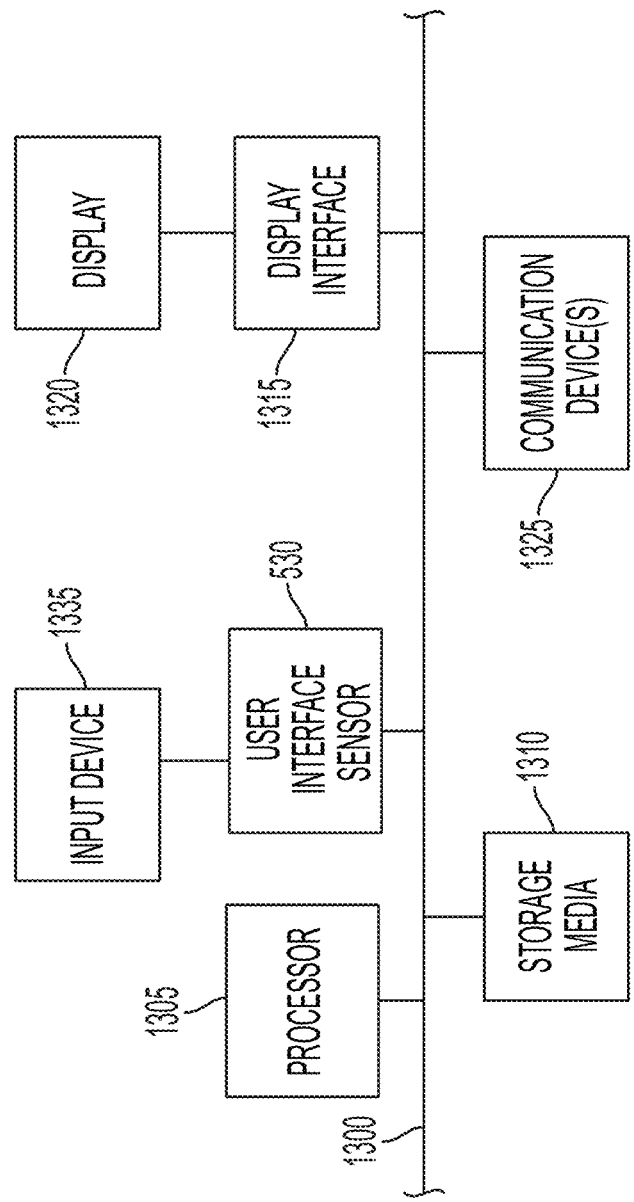

SYSTEMS AND METHODS FOR IMPROVED OBJECT PLACEMENT SENSING FOR POINT-OF-PURCHASE SALES

BACKGROUND

The present disclosure relates to pressure-sensitive conductive sheets and, in particular, to stretchable pressure-sensitive conductive sheets positioned over a 3-dimensional surface to improve sensing performance and analysis.

Pressure-sensitive conductive sheets are materials in which the electrical resistance is altered with the application of pressure against the materials. Generally, pressure-sensitive conductive sheets include a polymeric foil impregnated with carbon black, which makes the sheets electrically conductive. Examples of pressure-sensitive conductive sheets include those sold under the names "VELOSTAT®" and "LINQSTAT™". Squeezing or pressing against the pressure-sensitive conductive sheets lowers the electrical resistance of the sheets. This has resulted in this material being used in the manufacture of inexpensive sensors for use with microcontrollers.

One of the technology advancements in the retail industry is that of smart shelves. Smart shelves are equipped with sensors to monitor items are on a shelf, and when an item is taken out from the shelf. This data can be used for consumer shopping behavior study and restocking scheduling. One common application of pressure-sensitive conductive sheets is their use as weight sensors, such as weight sensors in smart Point-of-Purchase (PoP) display smart shelf liners, detecting the presence of products for purchase on the display shelf.

In a conventional approach, pressure-sensitive conductive sheets are used for object placement sensing. This method requires pressure-sensitive conductive sheets including three layers: a top conductive sheet, a bottom conductive sheet, and a pressure-sensitive conductive sheet positioned therebetween. When pressure changes, due to the placement of an item onto the pressure-sensitive conductive sheet, a resistance value through the pressure-sensitive conductive sheet changes, which can then be measured. Issues with this and other similar methods include cost issues and issues pertaining to the reliability of the pressure-sensitive conductive sheet layer interface.

Another conventional approach includes the use of capacitive sensing. Using this approach, when an item is touching the surface of a shelf, the capacitance of the touch sensor increases. However, since the bottom of an item may not be flat, it is difficult to obtain a reliable reading.

For at least these reasons, a modified and reliable pressure-sensitive conductive sheet system capable of object position detection using fabric displacement and measuring change of conductance is needed.

SUMMARY

According to an aspect of the present disclosure, a system for monitoring object placement on a surface is provided. The system includes a pressure-sensitive conductive sheet. The pressure-sensitive conductive sheet includes a stretchable fabric, having a plurality of fibers, and a conductive material positioned on a plurality of adjoining fibers of the stretchable fabric. The system further includes a 3-dimensional structure positioned under the pressure-sensitive conductive sheet. The 3-dimensional structure includes one or more depressions onto which the stretchable fabric can be stretched and the conductive material is positioned over the one or more depressions.

According to various embodiments of the present disclosure, the pressure-sensitive conductive sheet is configured to increase an electrical conductance of the pressure-sensitive conductive sheet and decrease an electrical resistance of the pressure-sensitive conductive sheet in response to application of pressure against the stretchable fabric.

According to various embodiments of the present disclosure, the pressure-sensitive conductive sheet is configured to decrease an electrical conductance of the pressure-sensitive conductive sheet and increase an electrical resistance of the pressure-sensitive conductive sheet in response to application of pressure against the stretchable fabric.

According to various embodiments of the present disclosure, the fibers of the stretchable fabric include a plurality of interlocking loops, and the conductive material is fused to two or more adjoining interlocking loops.

According to various embodiments of the present disclosure, the one or more depressions have a depth of approximately 1-10 mm.

According to various embodiments of the present disclosure, the one or more depressions includes a plurality of depressions positioned on the 3-dimensional structure in a repeating pattern.

According to various embodiments of the present disclosure, the conductive material is positioned over each of the one or more depressions.

According to various embodiments of the present disclosure, the conductive material forms a pattern on the stretchable fabric.

According to various embodiments of the present disclosure, the conductive material comprises a conductive ink.

According to various embodiments of the present disclosure, the conductive ink includes silver.

According to various embodiments of the present disclosure, the system further includes an electrical resistance measurement device configured to detect changes in the electrical conductance or the electrical resistance in the pressure-sensitive conductive sheet.

According to various embodiments of the present disclosure, the pressure-sensitive conductive sheet further includes a support sheet positioned between the stretchable fabric and the 3-dimensional structure. According to various embodiments, the support sheet is coupled to the stretchable fabric.

According to various embodiments of the present disclosure, the support sheet includes rubber.

According to various embodiments of the present disclosure, the system further includes an adhesive configured to secure the pressure-sensitive conductive sheet over the one or more depressions.

According to another aspect of the present disclosure, s method for monitoring object placement on a surface is provided. The method includes placing an object onto a pressure-sensitive conductive sheet. The pressure-sensitive conductive sheet includes a stretchable fabric, having a plurality of fibers, and a conductive material positioned on a plurality of adjoining fibers of the stretchable fabric and over one or more depressions formed within a 3-dimensional structure. Placing the object onto the pressure-sensitive conductive sheet applies pressure against the pressure-sensitive conductive sheet and deforms a portion of the pressure-sensitive conductive sheet to conform to one or more depressions formed within the 3-dimensional structure. The method further includes measuring a change in resistance of the pressure-sensitive conductive sheet, and, based on the change in resistance, determining whether an object has been placed onto, or removed from, the pressure-sensitive conductive sheet.

According to various embodiments of the present disclosure, the pressure-sensitive conductive sheet is configured to increase an electrical conductance of the pressure-sensitive conductive sheet and decrease an electrical resistance of the pressure-sensitive conductive sheet with the application of pressure against the stretchable fabric. The determining includes sensing an increase or decrease in the electrical resistance of the pressure-sensitive conductive sheet.

According to various aspects of the present disclosure, the fibers of the stretchable fabric comprise a plurality of interlocking loops, and the conductive material is fused to two or more adjoining interlocking loops.

According to various aspects of the present disclosure, placing the object includes applying an increase in pressure between the two or more adjoining interlocking loops.

According to various aspects of the present disclosure, the method further includes securing the pressure-sensitive conductive sheet over the 3-dimensional structure.

According to various aspects of the present disclosure, the conductive material is positioned over the one or more depressions.

BRIEF DESCRIPTION OF THE DRAWINGS

FIG. 13 illustrates a block diagram of example hardware that may be used to contain or implement program instructions according to various embodiments of the present disclosure.

DETAILED DESCRIPTION

As used in this document, the singular forms "a," "an," and "the" include plural references unless the context clearly dictates otherwise. Unless defined otherwise, all technical and scientific terms used herein have the same meanings as commonly understood by one of ordinary skill in the art. When used in this document, the term "comprising" (or "comprises") means "including (or includes), but not limited to." When used in this document, the term "exemplary" is intended to mean "by way of example" and is not intended to indicate that a particular exemplary item is preferred or required.

In this document, the term "approximately," when used in connection with a numeric value, is intended to include values that are close to, but not exactly, the number. For example, in some embodiments, the term "approximately" may include values that are within +/−10 percent of the value.

Other terms that are relevant to this disclosure are defined at the end of this Detailed Description section.

Figure 1A:
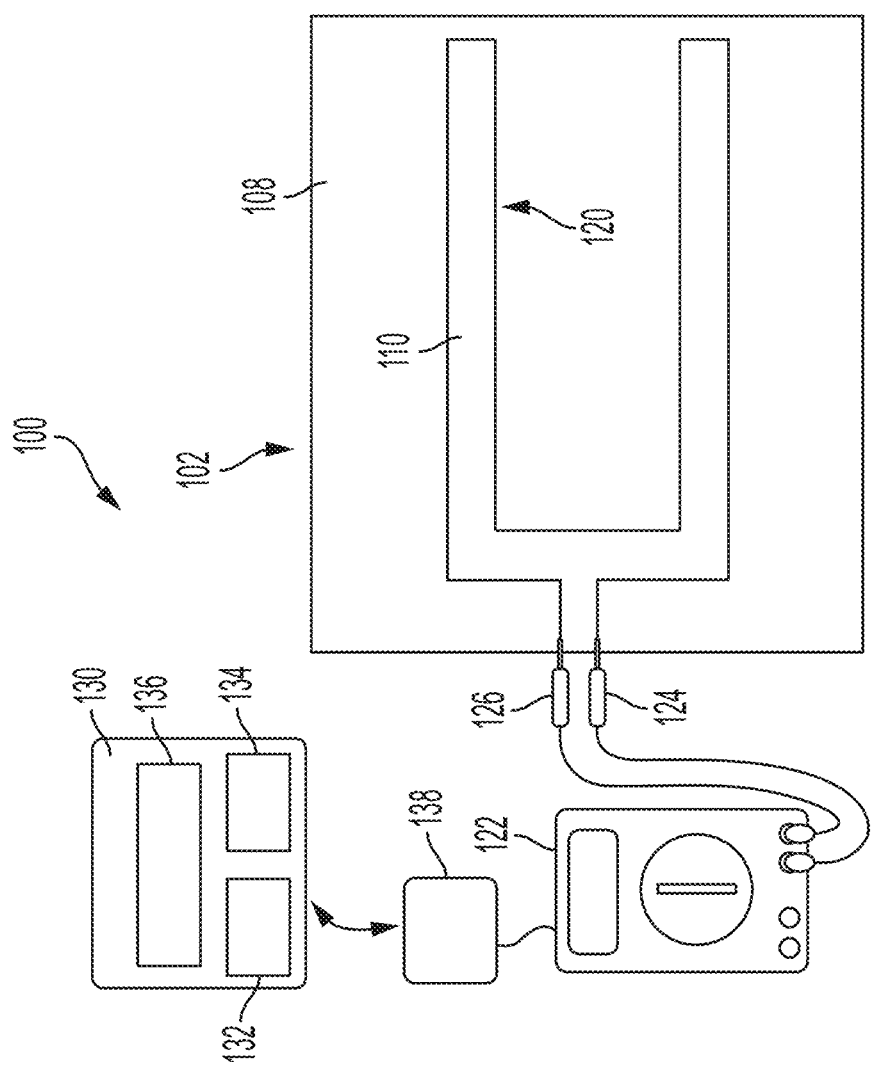
FIG. 1A is a top view of an example of a system for detecting one or more objects placed onto a pressure-sensitive conductive sheet ("PSCS"), in accordance with various embodiments of the present disclosure.
Figure 1B:
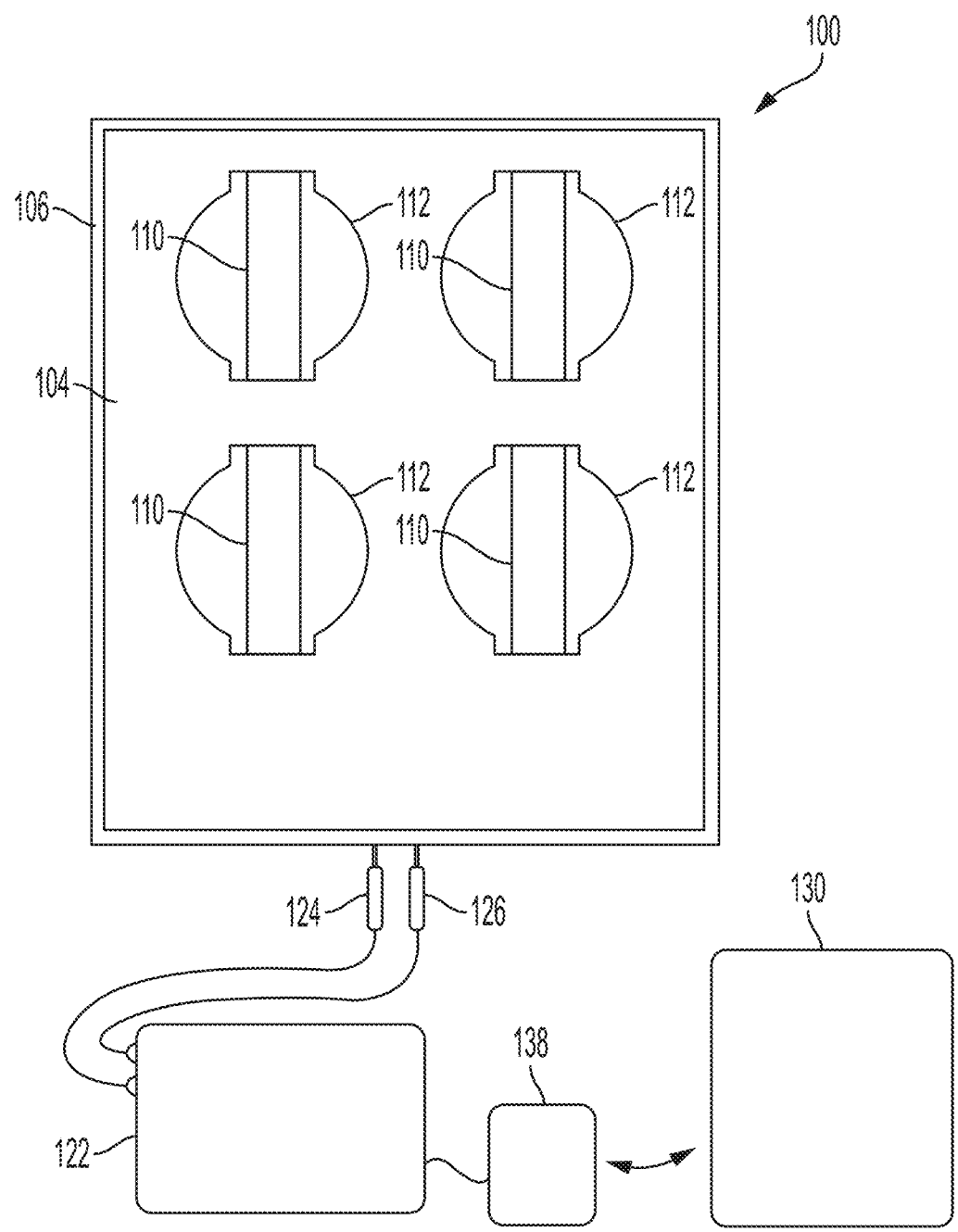
FIG. 1B is a bottom view of an example of a system for detecting one or more objects placed onto a PSCS, in accordance with various embodiments of the present disclosure.

Referring now to FIGS. 1A-1B, a top view (FIG. 1A) and a bottom view (FIG. 1B) of a system 100 for detecting placement and displacement of one or more objects placed onto a pressure-sensitive conductive sheet ("PSCS") 102, positioned over a 3-dimensional structure 104, is provided.

According to various embodiments, the system 100 includes a PSCS 102. The PSCS 102 may include a stretchable fabric 106, having a plurality of fibers woven together. For example, the plurality of fibers may include a plurality of interlocking loops 108 (shown in FIG. 3). The PSCS 102 may further include a conductive material 110 fused to a plurality of the fibers. The stretchability of the stretchable fabric 106 may be due to the elasticity of the fibers of the stretchable fabric 106 and/or due to the organization of the fibers in the stretchable fabric 106. According to various embodiments, the stretchable fabric 106 may include polyester.

According to various embodiments, the conductive material 110 is fused to two or more adjoining interlocking loops 108. The conductive material 110 may include a conductive ink and/or any other suitable conductive material for fusing to the stretchable fabric 106. According to various embodiments, the conductive material 110 includes a conductive ink including silver such as, for example, that sold under the name "LIQUIDX®."

Figure 3:
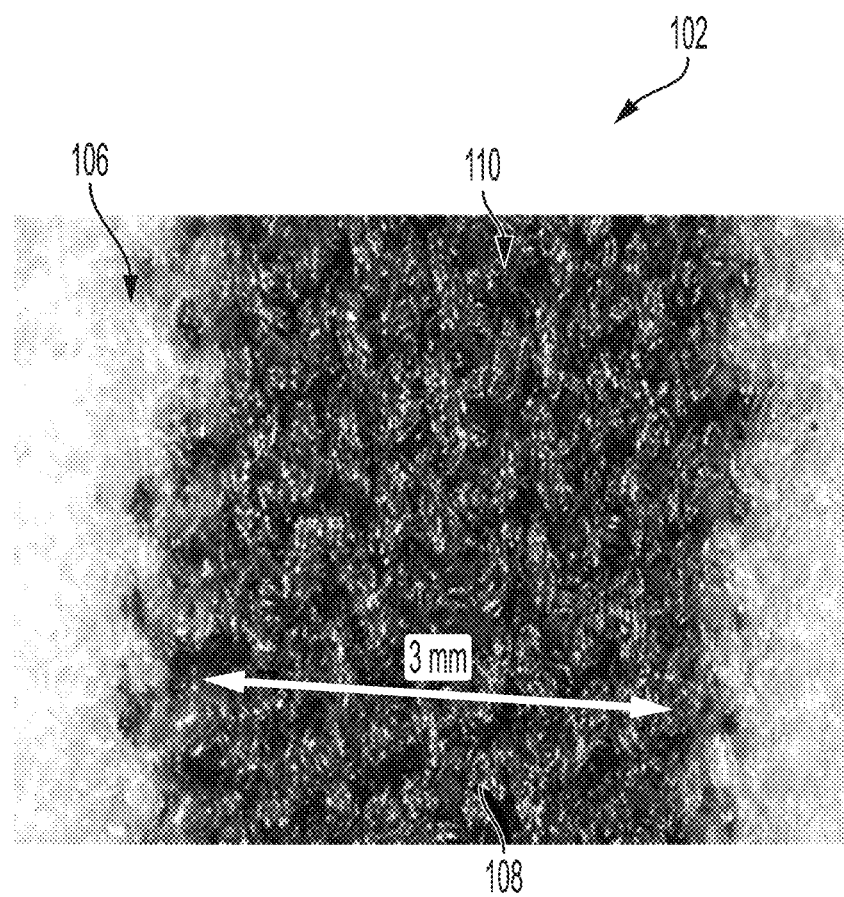
FIG. 3 is an example of a stretchable fabric having a conductive material applied thereto, in accordance with various embodiments of the present disclosure.

As shown in FIG. 3, conductive material 110 is fused to multiple fibers and multiple interlocking loops 108 of a textured stretchable fabric 106 such as, for example, a textured polyester fabric. According to various embodiments, the conductive material 110 is approximately uniformly applied to a surface of the stretchable fabric 106.

The conductive material 110 causes the PSCS 102 to have a measurable electrical conductance and resistance. Applying pressure to the PSCS 102 causes the PSCS 102 to deform, stretching multiple fibers of the stretchable fabric 106, causing strain between a plurality of the fibers and changes in pressure between adjoining fibers fused with the conductive material 110, resulting in changes to the electrical conductance and resistance of the PSCS 102.

According to various embodiments, when the stretchable fabric 106 is stretched in one or more directions, the spaces between fibers will become smaller and the individual fibers and/or the interlocking loops 108 become more closely in contact with each other, resulting in an increase in electrical conductance of the PSCS 102. According to one or more alternative embodiments in which a direction of stretch is perpendicular to an orientation of the fibers to which the conductive material 110 is attached, the fibers become less closely in contact with each other, resulting in a decrease in the electrical conductance of the PSCS 102. In each of these embodiments, a change in the electrical conductance of the PSCS 102 occurs with a deformation of the stretchable fabric 106, which can be measured. For example, FIG. 4 shows an example of a plot of measured relative resistance as a function of the percentage of stretch for a stretchable fabric 106 such as that illustratively depicted in FIG. 3.

Figure 4:
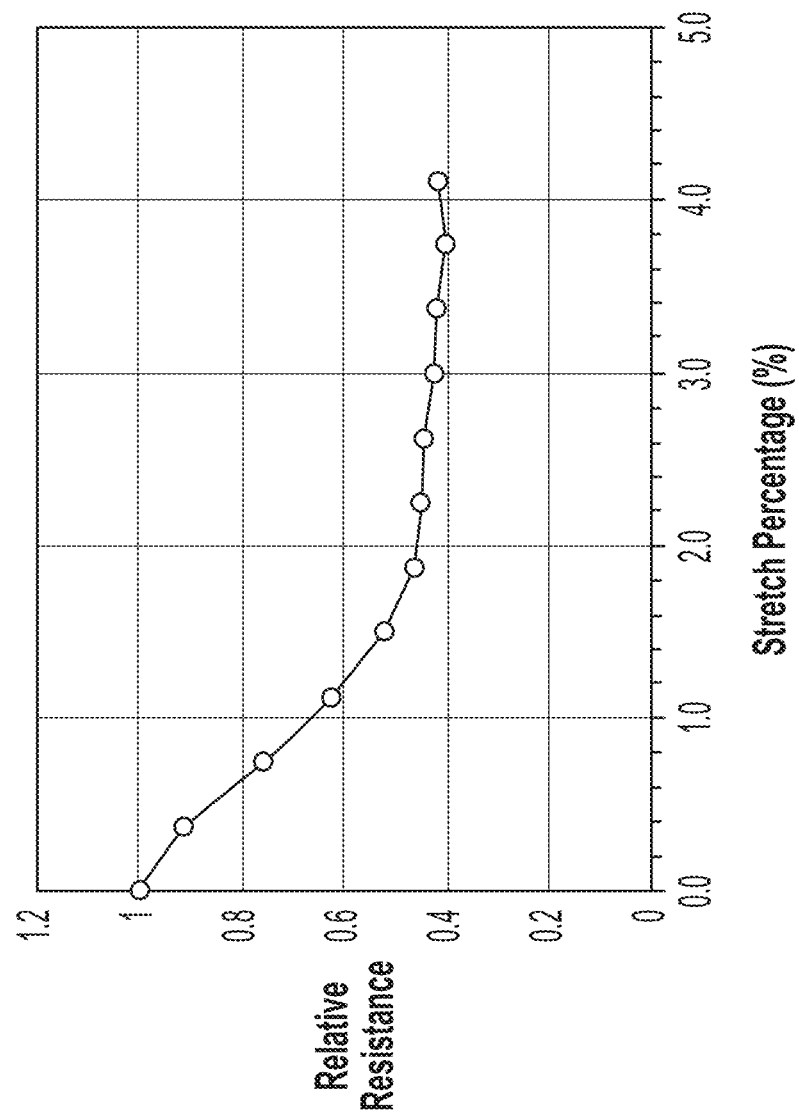
FIG. 4 is a graphical representation of electrical resistance measured with respect to the application of a percentage of stretch of the PSCS, in accordance with various embodiments of the present disclosure.

The measurements illustratively depicted in FIG. 4 were conducted on a polyester fabric 106 printed with silver ink 110. The width and length of the conductive material 110 measured is approximately 3 mm and 450 mm, respectively.

According to the example measurements graphically illustrated in FIG. 4, when the stretchable fabric 106 is in a relaxed state, the stretchable fabric 106 has a high resistance value. With the application of slight stretching (for example, a stretch percentage of 1.5%), the resistance value drops to approximately 50% of its maximum value (reached while the stretchable fabric 106 is in the relaxed state). According to the measurements taken in the example shown in FIG. 4, the resistance value saturates at a level of approximately 40% with the application of further stretching of the stretchable fabric 106. Therefore, according to the example shown in FIG. 4, the conductive trace is increasingly sensitive in the transition region between the relaxed state and a slightly stretching state (for example, a stretch percentage of less than approximately 2.0%). This sensitivity can be utilized for object placement detection.

Figure 2:
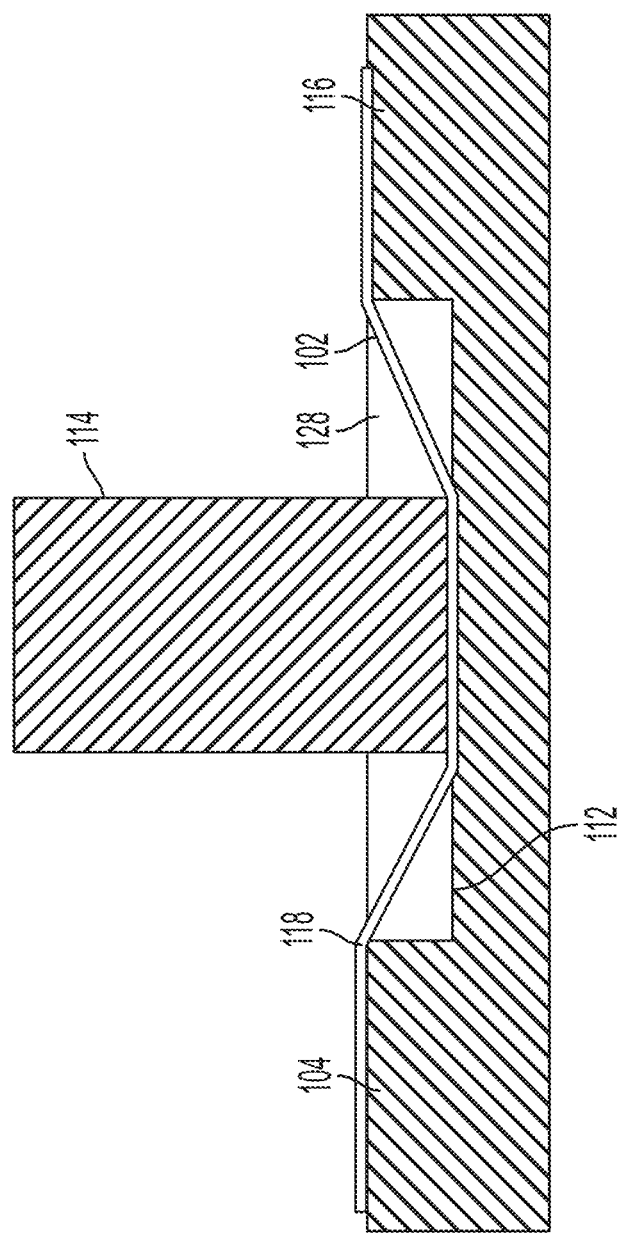
FIG. 2 is a segmented view of a PSCS positioned on a 3-dimensional structure, in accordance with various embodiments of the present disclosure.

According to various embodiments, the PSCS 102 is positioned over a 3-dimensional structure 104. The 3-dimensional structure 104 includes one or more recessed structures or depressions 112 (as shown in FIG. 2) configured to receive one or more objects 114. According to various embodiments, each of the depressions 112 has a recessed depth range of approximately 1-10 mm. It is noted, however, that other recessed depths may additionally, or alternatively, be incorporated into the 3-dimensional structure 104, while still maintaining the spirit and functionality of the present disclosure.

According to various embodiments, the 3-dimensional structure 104 is a patterned 3-dimensional structure. In the patterned 3-dimensional structure 104, a plurality of depressions 112 are organized in a repeated arrangement such as, for example, the arrangement of depressions 112 shown in FIG. 1B. The placement of the one or more objects 114 being received by the plurality of depressions 112 conforms to this arrangement. According to various embodiments, the position of the plurality of depressions 112 in the patterned 3-dimensional structure 104 conform to projected placement of the one or more objects 114 on a shelf.

According to various embodiments, the PSCS 102 is positioned over the 3-dimensional structure 104. The PSCS 102 may be secured over the 3-dimensional structure 104 using a securing mechanism such as, for example, an adhesive 116, one or more clamps, one or more hook and loop fasteners, one or more snap fasteners, and/or any other suitable form of securing mechanism.

According to various embodiments, when an item/object 114 is placed atop a surface of the PSCS 102, the stretchable fabric 106 is pressed into the depression 112, stretching the stretchable fabric 106. According to various embodiments, each of the depressions 112 includes a recessed edge 118 along a rim of the depression 112. When the stretchable fabric 106 stretches into the depression 112, an amount of tension in the stretchable fabric 106 is generated about the recessed edge 118. This tension in the stretchable fabric 106 causes a change in the electrical resistance of the PSCS 102. According to various embodiments, the tension about the recessed edge 118 causes a decrease in the electrical resistance of the PSCS 102. When an object 114 is removed from the PSCS 102, the PSCS 102 returns to approximately its relaxed state, causing the resistance of the PSCS 102 to change upward or downward in a step function.

According to various embodiments, the conductive material 110 is applied to the stretchable fabric 106 in the shape of a conductive grid pattern 120. The conductive grid pattern 120 is configured to extend from an electrical resistance measurement device 122, configured to measure a change in electrical resistance in the PSCS 102, to the one or more depressions 112. The electrical resistance measurement device 122 may be, for example, a multimeter, an ohmmeter, and/or any other suitable sensor configured to measure a change in electrical resistance of the PSCS 102. According to various embodiments, the conductive material 110 is positioned over each of the one or more depressions 112 such that the conductive material 110 is positioned over a portion of each of the recessed edges 118. According to some embodiments, the grid pattern 120 forms a closed loop, extending from a first probe 124 of the electrical resistance measurement device 122 to a second probe 126 of the electrical resistance measurement device 122.

According to various embodiments, the conductive grid pattern 120 is designed using a graphical user interface 136 coupled to a computer 130 running computer software. According to various embodiments, the computer 130 sends a print signal to a printer and the pattern 120 is printed onto the stretchable fabric 106. A fusing temperature, at which the pattern 120 is fused to the stretchable fabric 106 may differ depending upon the conductive material 110 used and/or the material used to form the stretchable fabric 106. The designed conductive grid patterns may, according to some embodiments, be sent, as a print job, to a print device for applying the conductive grid pattern 120 onto the stretchable fabric 106. It is noted, however, that other means and methods of applying the conductive material 110 to the stretchable fabric 106 may, in addition or alternatively, be used, while maintaining the spirit and functionality of the present disclosure.

The depressions 112 may be configured to receive all or a portion of a bottom surface of an object 114, enabling the object to stretch the stretchable fabric 106 into a cavity 128 formed by the depression 112. For example, as shown in FIG. 1, each of the depressions 112 is circular in nature, enabling a can, bottle, and/or similarly-shaped item to be set down within the depression 112. According to a non-limiting example, the 3-dimensional structure 104 as shown in FIG. 1 may include a 6 mm thick plastic plate with 2 mm×2 mm cut-off disks, although other suitable dimensions may additionally, or alternatively, be implemented for one or more elements of system 100. On the front of the 3-dimensional structure 104 is applied the PSCS 102, which may include polyester fabric as the stretchable fabric 106, and the conductive grid pattern 120 has a long conductive trace routed through each disk 112 twice for enhancing the signal due to edge stressing. According to various embodiments, the electrical resistance measurement device 122 may be coupled to an electronic computing device 130 via wired and/or wireless connection and/or may be coupled to a transceiver 138 such as, for example, a Bluetooth-based circuit, for remote resistance measurement. Any of the electrical resistance measurement device 122, the electronic computing device 130, and/or the transceiver 138 may be in electronic communication with each other. The electronic computing device 130 may include a processor 132, a memory 134, a graphical user interface 136 (which may include a display), and/or any other suitable electronic and/or computational components. The electronic computing device 130 may be, for example, a desktop computer, a laptop computer, a tablet computer, an onsite and/or remote server, and/or any other suitable computing device.

Figure 5:
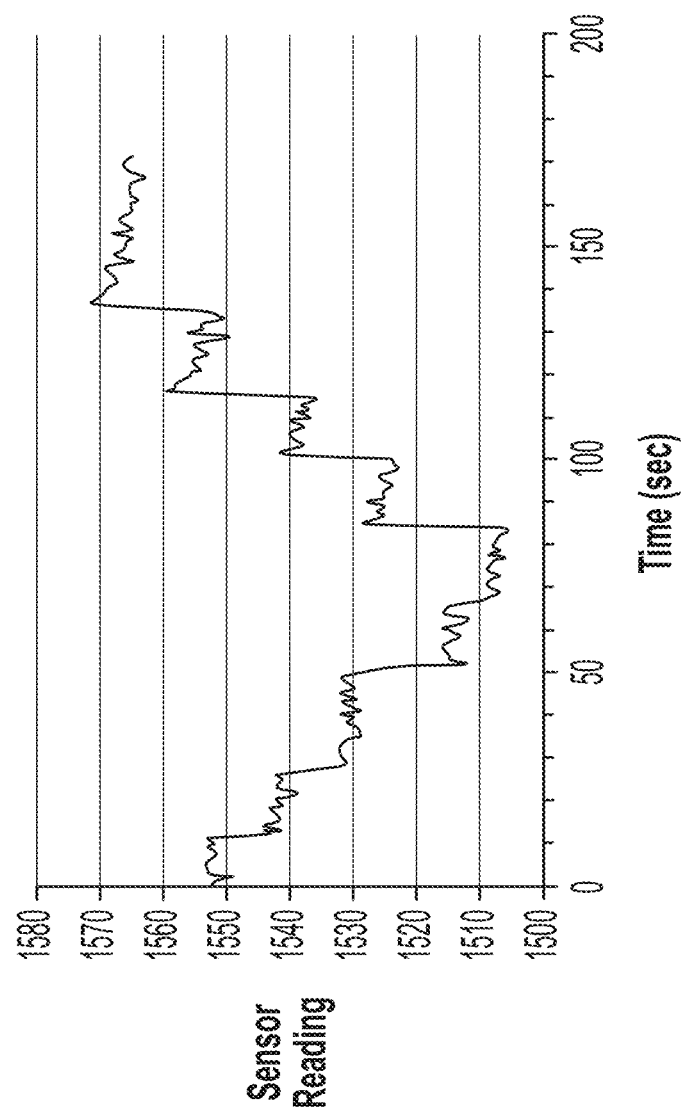
FIG. 5 is a graphical representation of electrical resistance measured with respect to time, in accordance with various embodiments of the present disclosure.

The system 100 as shown in FIG. 1 has 4 distinct depressions 112, each depression 112 configured to receive an object 114 (as shown in FIG. 2). A graphical representation of electrical resistance measured using a similar system 100 is illustrated in FIG. 5. During a first period (approximately from 0 to 85 seconds), 4 items/objects 114 are placed onto the circular depressions 112, one by one. With the application of each object 114, the measured electrical resistance decreases in a relative step pattern. During the second period (approximately 85 to 180 second), each of the four objects 114 are removed from the PSCS 102, resulting in four distinctive upward steps in the electrical resistance data curve. It is noted that, when an object 114 is removed from the PSCS 102, the electrical resistance value may not return to its original value, since the fibers in the conductive region (the conductive grid 120, which includes the conductive material 110) may not be recovered to the same shape as they were prior to the application of the object or objects 114. However, even though the resistance may not return to exactly the same resistance, an object 114 placement is detected by a distinguished step, upward or downward, and not by the absolute resistance value. It is further noted that, depending on the materials used in the manufacture of the PSCS 102, the application of an object 114 may result in an upward or downward change in the resistance, and the removal of an object 114 may result in an opposing upward or downward change in the resistance.

As described above, the most sensitive part of the PSCS 102 is near each of the recessed edges 118, where a slight stressing of the stretchable fabric 106 may cause a significant change in the measured electrical resistance of the PSCS 102. Based on this feature of the system 100, various embodiments are developed as discussed below.

Figure 6:
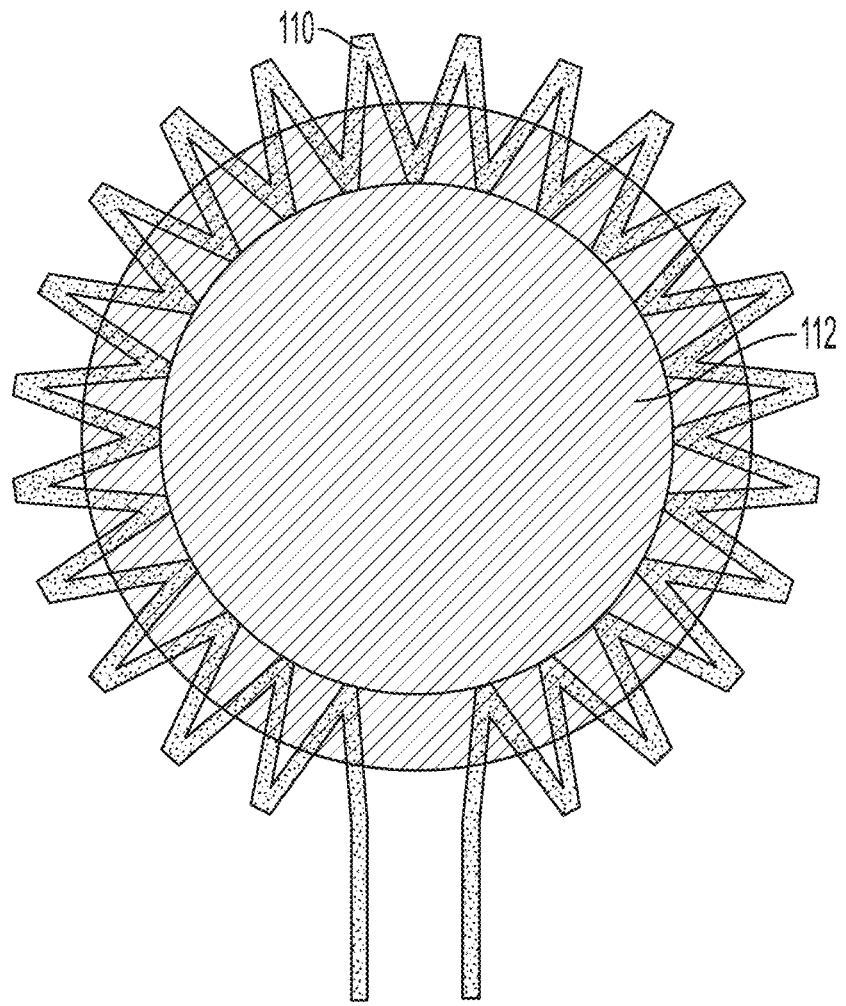
FIG. 6 is a top view of a PSCS having a zig-zag-shaped conductive grid pattern, in accordance with various embodiments of the present disclosure.
Figure 7:
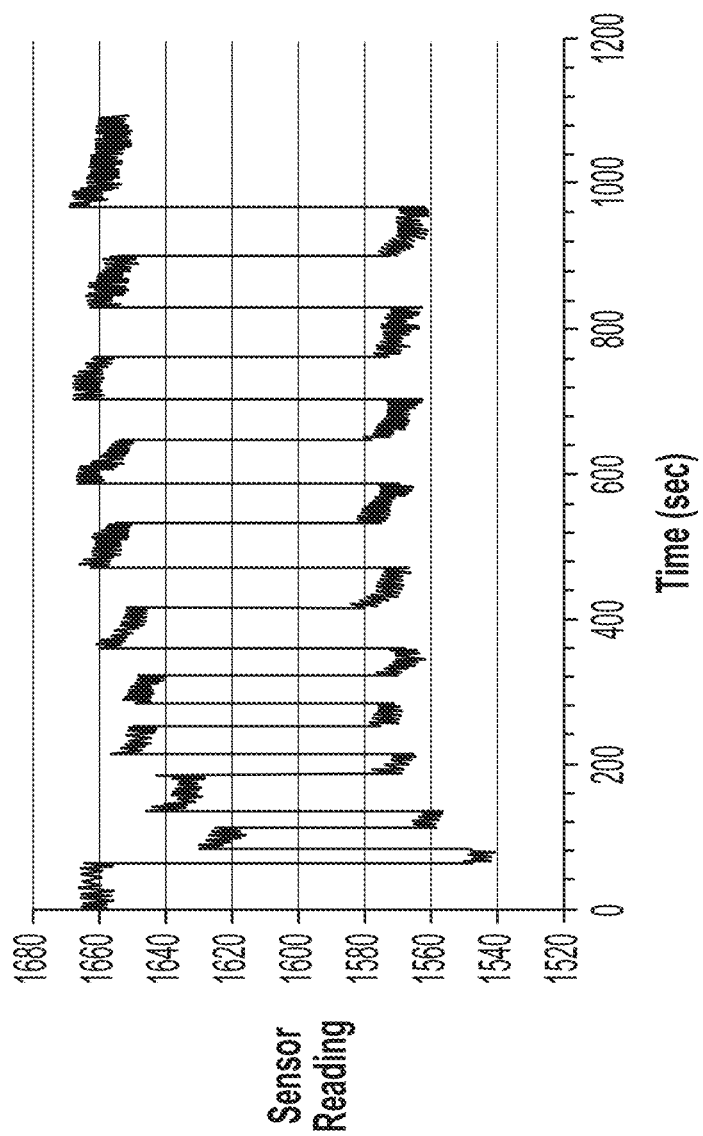
FIG. 7 is a graphical representation of electrical resistance measured with respect to time for a PSCS having a zig-zag-shaped conductive grid pattern, in accordance with various embodiments of the present disclosure.

As shown in FIG. 6, the conductive grid design 112 includes a zig-zag pattern which surrounds the recessed edge 118 of the depression 112. With this design and/or similar zig-zag designs surrounding depressions of various shapes and sizes, there are plurality of conductive segments (which include conductive material 110) in the pattern 112 that are routed through the recessed edge 118 location, which is positioned underneath. An example of electrical resistance measured using a system 100 having a zig-zag pattern 112 is illustrated in FIG. 7, which shows electrical resistance over time of an object being repeatedly placed onto the PSCS 102 and removed from the PSCS 102. Since the zig-zag pattern causes more of the conductive material to be in the path of the recessed edge (compared with the pattern 112 shown in FIG. 1), the signal change (as shown in FIG. 7) between an object-on position and an object-off position is significantly improved.

Figure 8:
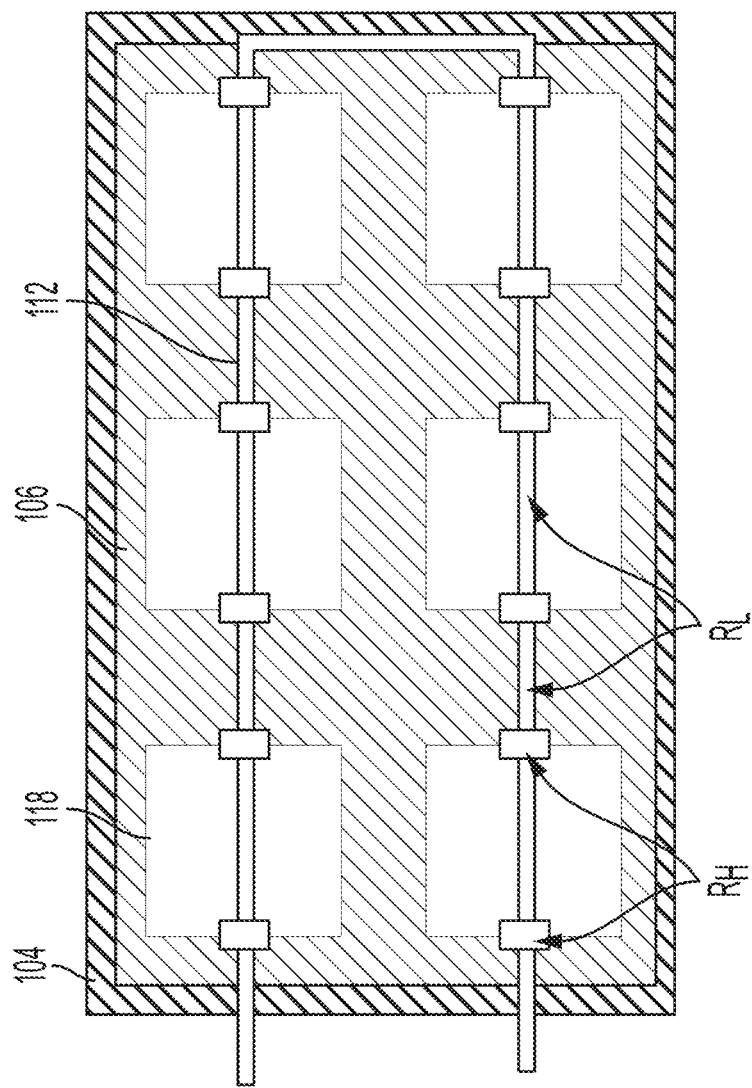
FIG. 8 is a top view of a PSCS having a conductive grid pattern with areas of high resistance and areas of low resistance, in accordance with various embodiments of the present disclosure.

According to various embodiments, the conductive grid pattern 112 may include sections of high resistance and low resistance, such as that shown in FIG. 8. A conductive pattern 112 may be formed by high resistance and low resistance elements connected in series. As shown in FIG. 8, high resistance elements, $R_H$, of the pattern 112 are positioned around the recessed edge 118 of the 3-dimensional structure 104. The remaining conductive grid pattern 112 includes low resistance elements, $R_L$. The $R_H$ sections may be positioned such that they are in contact with the recessed edges 118 of the 3-dimensional structure 104. According to various embodiments, $R_H$ sections may include, for example, LIQUIDX® silver ink printed onto the stretchable fabric, and $R_L$ sections may include, for example, extruded silver, with sections wider than that of the $R_H$ sections. It is noted, however, that means other than, or in addition to, printing may be used in the application of the conductive material onto the stretchable fabric. It is also noted that other materials having differing resistance levels may, in addition or alternatively, be used in the conductive material or materials 110.

When an object 114 is placed onto the PSCS 102 having $R_H$ and $R_L$ sections, a majority of the stress to the PSCS 102 occurs at the recessed edges 118, including the $R_H$ sections. Since the $R_L$ sections have a lower electrical resistance than the $R_H$ sections, the relative change in electrical resistance is enhanced according to the following equation:

$$\frac{\Delta R}{R_{total}} = \frac{\Delta R_H}{R_H + R_L}$$

The equation indicates that the change in electrical resistance ($\Delta R$) divided by the total resistance ($R_{total}$) is equal to the change in high resistance ($\Delta R_H$) divided by the sum of the high resistance ($R_H$) and the low resistance ($R_L$).

Figure 9A:
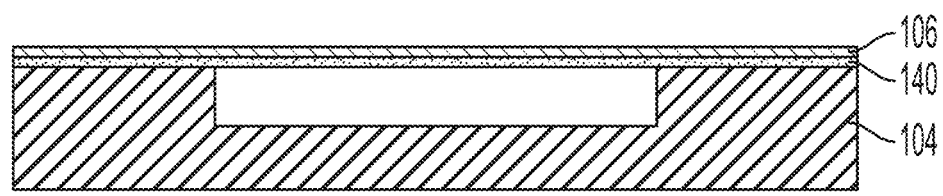
FIG. 9A is a segmented view of a PSCS having a support sheet, in a relaxed position, in accordance with various embodiments of the present disclosure.
Figure 9B:
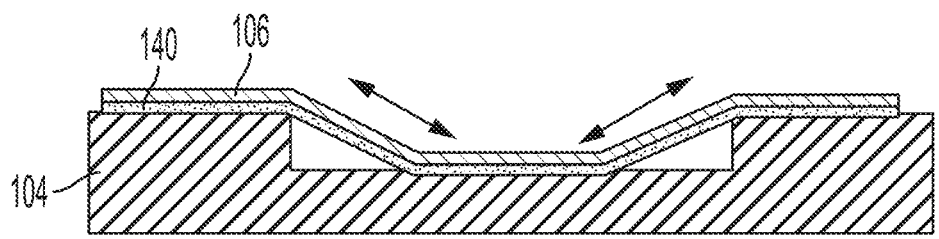
FIG. 9B is a segmented view of a PSCS having a support sheet, in a compressed position, in accordance with various embodiments of the present disclosure.

Depending upon physical characteristics of the stretchable fabric 106 such as, for example, the strength of the fabric 106, the elasticity of the fabric 106, the weight of the fabric 106, the tautness of the fabric 106 over the 3-dimensional structure 104, and/or any other relevant physical characteristics, the stretchable fabric 106, or a portion of the stretchable fabric 106, may be stretched by its own weight. According to various embodiments, a support layer or sheet 140 is positioned between the stretchable fabric 106 and the 3-dimensional structure 104, as shown in FIGS. 9A-9B. According to various embodiments, the support layer or sheet 140 is coupled to the stretchable fabric 106. Alternatively, the stretchable fabric 106 may be positioned between the support layer or sheet 140 and the 3-dimensional structure 104. The support layer or sheet 140 provides structural support to the stretchable fabric 106 and may enable stresses on the PSCS 102 to be more uniform when an object 114 is placed onto the PSCS 102 than when no support layer or sheet 140 is included. According to various embodiments, the support layer or sheet 140 may include rubber, foam, plastic, and/or any other suitable support material.

Figure 10A:
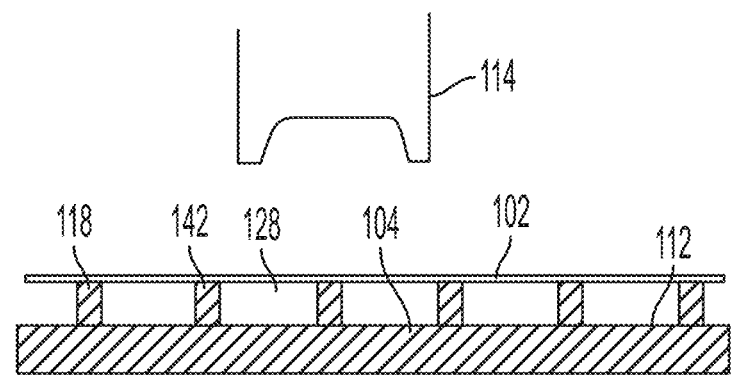
FIGS. 10A-10B are a segmented view (FIG. 10A) and a perspective view (FIG. 10B) of a 3-dimensional structure having a series of jutting portions, in accordance with various embodiments of the present disclosure.
Figure 10B:
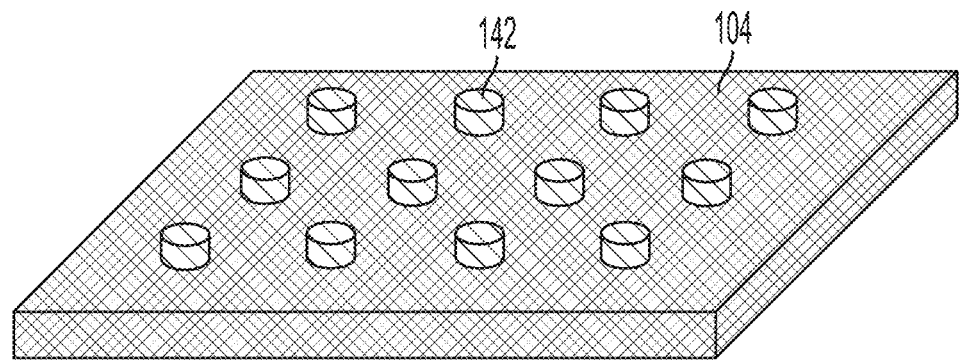

According to various embodiments, the depression is configured to only receive a portion of a bottom surface of an object 114. This may be due to an object 114 having an irregular shape, an object 114 having a non-flat bottom surface, and/or any other relevant reasons. In these instances, it may be beneficial for the 3-dimensional structure 104 to include a plurality of jutting portions 142, such as pillars, and the depressions 112 form between these jutting portions 142. Such an example is illustrated in FIGS. 10A-10B. According to various embodiments, the jutting structures 142 may be compressible.

According to various embodiments, the PSCS 102 is mounted and positioned on top of the pillars/jutting structures 142. When an object 114 is placed onto the stretchable fabric 106, certain areas of the stretchable fabric are stressed, causing changes in resistance. This structural design enables objects 114 with differing shapes and/or sizes to be detected. In the instance of a beverage can, which includes a concave bottom surface, the 3-dimensional structure 104 is configured such that the bottom rim of the can fits between these jutting portions 142. Additionally, this configuration further enables the PSCS 102 to have a greater area on which the objects 114 may be placed while still being able to calculate a change in electrical resistance of the PSCS 102.

Figure 11:
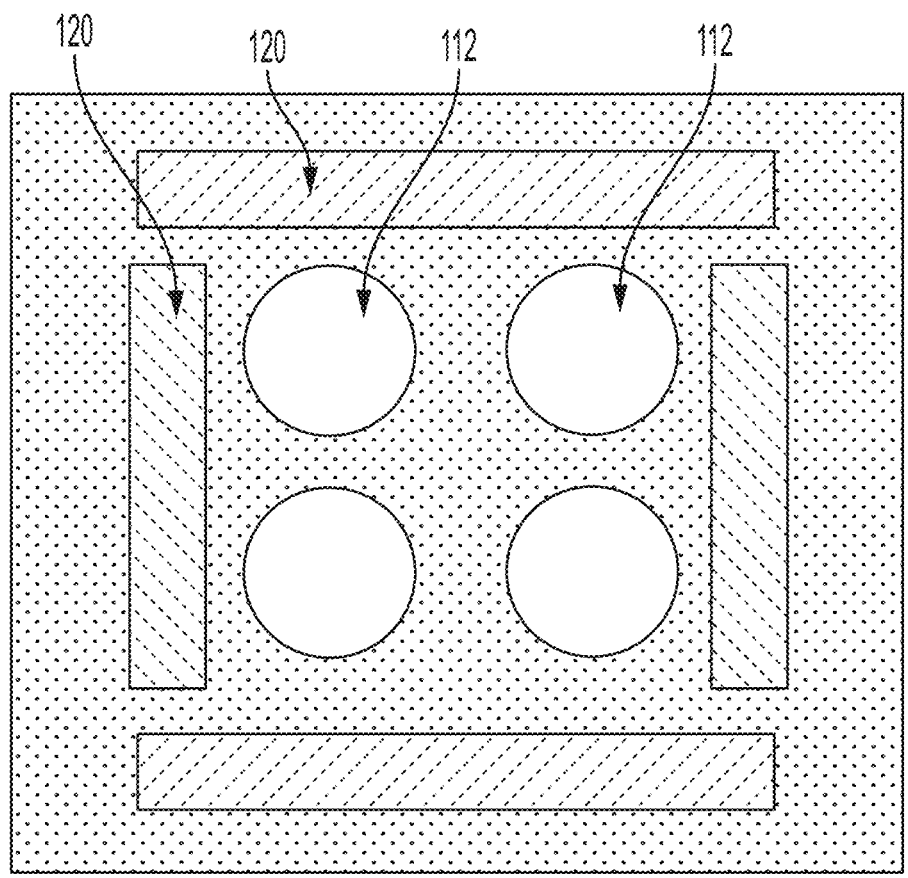
FIG. 11 is a top view of a PSCS, in accordance with various embodiments of the present disclosure.

It is further noted that, according to the basic working principle of various embodiments of the present disclosure, the 3-dimensional structure 104 is configured to create a small amount of stress in the stretchable fabric 106, wherein the stress causes a change in the electrical resistance in the PSCS 102. Since a fabric can distribute stress laterally, depending on its interface with the 3-dimensional structure 104, according to some embodiments it is not necessary to have geometrical overlap between the depression 112 area and the conductive grid 120. FIG. 11 shows an embodiment in which there is no geometrical overlap between the location of the depressions 112 in the 3-dimensional structure 104 and the conductive grid/pattern 120.

Figure 12:
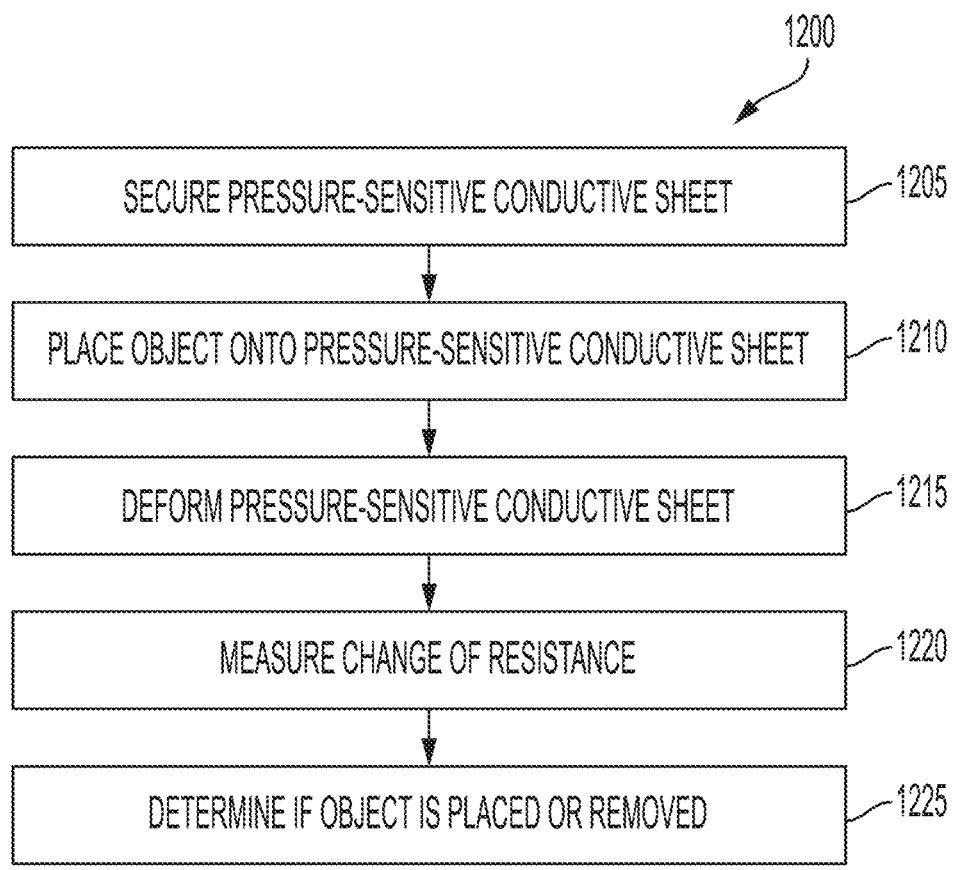
FIG. 12 is a flow diagram of a method for detecting one or more objects placed onto a PSCS, in accordance with various embodiments of the present disclosure.

Referring now to FIG. 12, a method 1200 for monitoring object placement on a surface is illustratively depicted, in accordance with various embodiments of the present disclosure.

At 1205, a pressure-sensitive conductive sheet is secured over a 3-dimensional structure. The pressure-sensitive conductive sheet includes a stretchable fabric, having a plurality of fibers, positioned over the 3-dimensional structure, and a conductive material positioned on a plurality of adjoining fibers of the stretchable fabric and over one or more depressions formed within the 3-dimensional structure. The securing may include the application of an adhesive, one or more clamps, one or more hook and loop fasteners, one or more snap fasteners, and/or any other suitable form of securing mechanism.

At 1210, an object is placed onto a pressure-sensitive conductive sheet. According to various embodiments, placing the object onto the pressure-sensitive conductive sheet applies pressure against the pressure-sensitive conductive sheet and, at 1215, a portion of the pressure-sensitive conductive sheet is deformed to conform to one or more depressions formed within the 3-dimensional structure, causing a stress in one or more areas of the pressure-sensitive conductive sheet. According to various embodiments, placing the object includes applying an increase in pressure between the two or more adjoining interlocking loops.

At 1220, a change in electrical resistance of the pressure-sensitive conductive sheet is measured after the placement of the object onto the pressure-sensitive conductive sheet. The change in electrical resistance is measured using one or more electrical resistance measurement devices coupled to the pressure-sensitive conductive sheet. The one or more electrical resistance measurement devices may include, for example, a multimeter, an ohmmeter, and/or any other suitable sensor for measuring a change in electrical resistance. At 1225, based on the measured change in resistance, it is determined whether an object has been placed onto the pressure-sensitive conductive sheet.

According to various embodiments, the pressure-sensitive conductive sheet is configured to increase an electrical conductance of the pressure-sensitive conductive sheet and decrease an electrical resistance of the pressure-sensitive conductive sheet with the application of pressure against the stretchable fabric. According to other various embodiments, the pressure-sensitive conductive sheet is configured to decrease an electrical conductance of the pressure-sensitive conductive sheet and increase an electrical resistance of the pressure-sensitive conductive sheet in response to application of pressure against the stretchable fabric.

Accordingly, determining whether an object has been placed onto the pressure-sensitive conductive sheet includes sensing an increase or decrease in the electrical resistance of the pressure-sensitive conductive sheet. According to various embodiments, software, run by one or more electronic computing devices in electronic communication with the one or more electrical resistance measurement devices, analyses the electrical resistance measured by the one or more electrical resistance measurement devices for the pressure-sensitive conductive sheet over a length of time. According to various embodiments, if a slope of an increase and/or decrease in resistance over time is greater than a threshold, than the increase and/or decrease in electrical resistance is marked as a step, indicating that an object has been placed on, or removed from, the pressure-sensitive conductive sheet.

FIG. 13 depicts an example of internal hardware that may be included in any of the electronic components of an electronic device as described in this disclosure such as, for example, an electronic computing device and/or any other integrated system and/or hardware that may be used to contain or implement program instructions.

A bus 1300 serves as the main information highway interconnecting the other illustrated components of the hardware. CPU 1305 is the central processing unit of the system, performing calculations and logic operations required to execute a program. CPU 1305, alone or in conjunction with one or more of the other elements disclosed in FIG. 5, is an example of a processor as such term is used within this disclosure. Read only memory (ROM) and random access memory (RAM) constitute examples of non-transitory computer-readable storage media 510, memory devices or data stores as such terms are used within this disclosure.

Program instructions, software or interactive modules for providing the interface and performing any querying or analysis associated with one or more data sets may be stored in the computer-readable storage media 1310. Optionally, the program instructions may be stored on a tangible, non-transitory computer-readable medium or portable memory device such as a compact disk, a digital disk, flash memory, a memory card, a USB drive, an optical disc storage medium and/or other recording medium.

An optional display interface 1315 may permit information from the bus 1300 to be displayed on the display 1320 in audio, visual, graphic or alphanumeric format. Communication with external devices may occur using various communication ports 1325. A communication port 1325 may be attached to a communications network, such as the Internet or an intranet. In various embodiments, communication with external devices may occur via one or more short range communication protocols.

The hardware may also include an interface 1330, such as graphical user interface, which allows for receipt of data from input devices such as a keyboard or other input device 1335 such as a mouse, a joystick, a touch screen, a remote control, a pointing device, a video input device and/or an audio input device.

In this document, "electronic communication" refers to the transmission of data via one or more signals between two or more electronic devices, whether through a wired or wireless network, and whether directly or indirectly via one or more intermediary devices. Devices are "communicatively connected" if the devices are able to send and/or receive data via electronic communication.

A "computer," "computing device," or "electronic device" refers to a device that includes a processor and non-transitory, computer-readable memory. The memory may contain program instructions that, when executed by the processor, cause the computing device to perform one or more operations according to the program instructions. Examples of computing devices include personal computers, servers, mainframes, gaming systems, televisions, and portable electronic devices such as smartphones, smart watches, wearable electronic devices, digital cameras, fitness tracking devices, tablet computers, laptop computers, media players and the like.

The term "print device" refers to a machine having hardware capable of receiving a digital document file and use the information from the file and associated print instructions to print a document represented in the file on a substrate and produce a physical document. Components of a print device typically include a print engine, which includes print hardware such as a print head, which may include components such as a print cartridge containing ink, toner or another print material, as well as a document feeding system configured to pass a substrate through the print device so that the print head can print characters and/or images on the substrate. A print device may have additional capabilities such as scanning or faxing and thus may be a multifunction device.

A "print job" refers to a set of instructions that causes a print device to print one or more document files. In this document, the set of instructions may be from a user to a print device, or it may be generated by a system or the print device after detecting a trigger event.

The features and functions described above, as well as alternatives, may be combined into many other different systems or applications. Various alternatives, modifications, variations or improvements may be made by those skilled in the art, each of which is also intended to be encompassed by the disclosed embodiments.

The invention claimed is:

1. A system for monitoring object placement on a surface, comprising:
   a pressure-sensitive conductive sheet, including:
      a stretchable fabric, having a plurality of fibers; and
      a conductive material positioned on a plurality of adjoining fibers of the stretchable fabric; and
   a 3-dimensional structure positioned under the pressure-sensitive conductive sheet, wherein:
      the 3-dimensional structure includes one or more recessed structures onto which the stretchable fabric can be stretched,
      the conductive material is positioned over the one or more recessed structures,
      the fibers of the stretchable fabric comprise a plurality of interlocking loops, and
      the conductive material is fused to two or more adjoining interlocking loops.

2. The system as recited in claim 1, wherein the pressure-sensitive conductive sheet is configured to increase an electrical conductance of the pressure-sensitive conductive sheet and decrease an electrical resistance of the pressure-sensitive conductive sheet in response to application of pressure against the stretchable fabric.

3. The system as recited in claim 1, wherein the pressure-sensitive conductive sheet is configured to decrease an electrical conductance of the pressure-sensitive conductive sheet and increase an electrical resistance of the pressure-sensitive conductive sheet in response to application of pressure against the stretchable fabric.

4. The system as recited in claim 1, wherein the one or more recessed structures have a depth of approximately 1-10 mm.

5. The system as recited in claim 1, wherein the one or more recessed structures includes a plurality of recessed structures positioned on the 3-dimensional structure in a repeating pattern.

6. The system as recited in claim 1, wherein the conductive material is positioned over each of the one or more recessed structures.

7. The system as recited in claim 1, wherein the conductive material forms a pattern on the stretchable fabric.

8. The system as recited in claim 1, wherein the conductive material comprises a conductive ink.

9. The system as recited in claim 8, wherein the conductive ink includes silver.

10. The system as recited in claim 2, further comprising an electrical resistance measurement device configured to detect changes in the electrical conductance or the electrical resistance in the pressure-sensitive conductive sheet.

11. The system as recited in claim 1, wherein the pressure-sensitive conductive sheet further includes a support sheet coupled to the stretchable fabric.

12. The system as recited in claim 11, wherein the support sheet includes rubber.

13. The system as recited in claim 1, further comprising:
   an adhesive configured to secure the pressure-sensitive conductive sheet over the one or more recessed structures.

* * * * *